United States Patent
Li

(10) Patent No.: US 7,795,807 B2
(45) Date of Patent: Sep. 14, 2010

(54) ORGANIC LIGHT EMITTING DISPLAY

(75) Inventor: Shi-Hao Li, Taipei County (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 450 days.

(21) Appl. No.: 11/379,234

(22) Filed: Apr. 19, 2006

(65) Prior Publication Data

US 2007/0103061 A1   May 10, 2007

(30) Foreign Application Priority Data

Nov. 10, 2005   (TW) .............................. 94139404 A

(51) Int. Cl.
*H01L 51/52* (2006.01)
(52) U.S. Cl. .................. 313/506; 445/24; 313/498
(58) Field of Classification Search ......... 313/498–512;
315/169.1, 169.3; 428/690–691, 917; 438/26–29,
438/34, 82; 257/40, 72, 98–100, 642–643,
257/759; 427/58, 64, 66, 532–535, 539;
445/24–25
See application file for complete search history.

(56) References Cited

U.S. PATENT DOCUMENTS

| | | | |
|---|---|---|---|
| 5,986,401 A | 11/1999 | Thompson et al. | |
| 6,351,066 B1 | 2/2002 | Yamazaki et al. | |
| 6,515,428 B1 | 2/2003 | Yeh et al. | |
| 6,844,674 B2 | 1/2005 | Chang et al. | |
| 6,850,005 B2 | 2/2005 | Yoneda et al. | |
| 7,135,815 B2 | 11/2006 | Tsuchiya | |
| 2003/0117071 A1* | 6/2003 | Lee et al. | 313/512 |
| 2003/0155860 A1* | 8/2003 | Choi et al. | 313/498 |
| 2005/0116615 A1* | 6/2005 | Matsumoto et al. | 313/500 |
| 2005/0139834 A1* | 6/2005 | Park et al. | 257/72 |
| 2005/0225237 A1* | 10/2005 | Winters | 313/506 |
| 2006/0038752 A1* | 2/2006 | Winters | 345/76 |
| 2007/0069635 A1* | 3/2007 | Cok | 313/504 |

FOREIGN PATENT DOCUMENTS

| | | |
|---|---|---|
| CN | 1440224 A | 9/2003 |
| CN | 1446035 A | 10/2003 |
| TW | 578438 | 3/2004 |
| TW | 586333 | 5/2004 |
| TW | I223969 | 11/2004 |
| TW | I231723 | 4/2005 |

\* cited by examiner

*Primary Examiner*—Nimeshkumar D Patel
*Assistant Examiner*—Donald L Raleigh
(74) *Attorney, Agent, or Firm*—Winston Hsu

(57) ABSTRACT

An OLED has a first substrate, a second substrate, a plurality of organic emitting elements positioned in each sub-pixel, and an antireflective layer. The ratio of the area of the antireflective layer to that of the sub-pixel is between about 60% to about 87%.

15 Claims, 3 Drawing Sheets

ORGANIC LIGHT EMITTING DISPLAY

BACKGROUND OF THE INVENTION

1. Field of the Invention

This invention relates to an organic light emitting display (OLED), and more particularly, to an OLED with a high contrast ratio on the display screen and a longer life time.

2. Description of the Prior Art

In various types of flat panel displays, since an OLED, being developed later than a liquid crystal display (LCD), has many beneficial characteristics, such as having a spontaneous light source, a wide viewing angle, high response velocity, power saving, strong contrast, high brightness, small thickness, full-color, simpler structure, and a wide operating temperature, the OLED has been used extensively in small and medium scale portable display fields. After continuous research and development by manufacturers and scholars, the break through of some unresolved problems, such as low yield rate, unsatisfied mask application, unstable cap seal, has provided eminent progress.

Since the conductors, electrodes, or other patterns made of metal in the OLED may reflect lights, its display images often has low quality caused by its unfavorable contrast ratio when the OLED is operated in an environment with strong ambient light. To improve the contrast ratio of the display images, according to the prior art, a polarizer is placed on the surface of the substrate of the OLED to reduce the reflection of the ambient light. However, although the polarizer may reduce the reflection of the ambient light effectively, at the mean time the penetration rate of the light produced by the OLED itself may be reduced to 42%, which causes the insufficient luminous efficiency. In addition, to compensate the deficient brightness of the display images caused by the insufficient luminous efficiency, high voltage has to be provided to the organic emitting elements to increase their luminosity. As a result, its power consumption is increased and the life time of the internal elements of the OLED is shortened. Therefore, the prior method of setting up a polarizer on the surface of the substrate still has its shortcoming which is that it cannot meet both the contrast ratio and luminosity requirement and the low power consumption requirement of the display.

SUMMARY OF THE INVENTION

It is therefore a primary objective of the claimed invention to provide a method and an OLED structure which an antireflective layer to increase the contrast ratio of the display images of the OLED to solve the above-mentioned prior problem of the unfavorable contrast ratio of the OLED.

According to the claimed invention, an OLED has a first substrate, a second substrate opposite to and under the first substrate, a plurality of organic emitting elements disposed in each of the sub-pixels, and an antireflective layer formed in each sub-pixel. The ratio of the area of the antireflective layer to the area of the sub-pixel is between about 60% and about 87%.

According to the claimed invention, a method to improve the contrast ratio of the OLED is provided. The OLED comprises a first substrate, a second substrate parallel and opposite to the first substrate, having a plurality of sub-pixels, a plurality of organic emitting elements and an antireflective layer in each of the sub-pixels, wherein the ratio of the area of the antireflective layer to the area of the sub-pixel is defined as the anti-reflect/sub-pixel ratio. This method comprises determining a first relation equation between the relative life time of the organic emitting elements and the anti-reflect/sub-pixel ratio based on the characteristics of the organic emitting elements, and then determining a second relation equation between the contrast ratio of the OLED and the anti-reflect/sub-pixel ratio based on the characteristics of the OLED. Then, a predetermined minimum value of the contrast ratio and a predetermined minimum value of the relative life time value are chosen to be used in the first relation equation and the second relation equation to calculate a preset range of the anti-reflect/sub-pixel ratio. In the end, based on the preset range of the anti-reflect/sub-pixel ratio, the portion in each sub-pixel which is occupied by the antireflective layer is designed to make the contrast ratio of the OLED equal to or more than the predetermined minimum value of the contrast ratio and to allow the relative life time of each organic emitting element in the OLED equal to or more than the predetermined minimum value of the relative life time value.

In the claimed invention, since the life time of the organic emitting elements and the contrast of the OLED are considered while designing the area occupied by the antireflective layer in each of the sub-pixel, an optimal range of the anti-reflect/sub-pixel ratio may be designed to satisfy the contrast ratio requirement of the OLED in the industry without reducing the life time of the organic emitting elements. And even a longer life time of each organic emitting elements can be provided according to the claimed invention.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
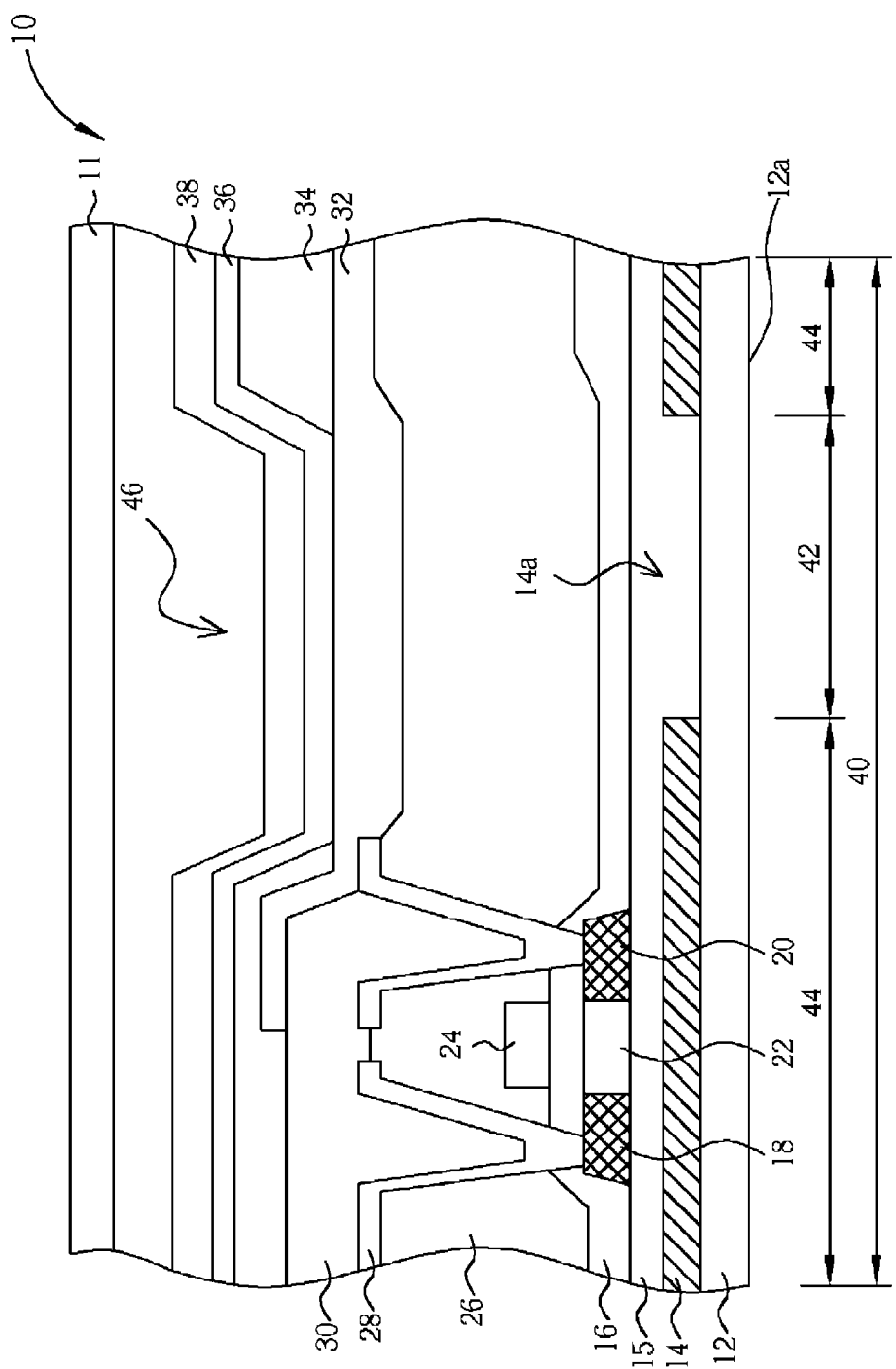
FIG. 1 is a side cross-section schematic diagram of an OLED of this invention.

Please refer to FIG. 1. FIG. 1 is a side cross-section schematic diagram of an OLED 10 of this invention. In this figure, only one single sub-pixel 40 was shown and used for explanation. As shown in FIG. 1, the OLED 10 of this invention comprises a first substrate 11 and a second substrate 12, wherein the first substrate 11 and the second substrate 12 are parallel to each other and jointed by sealant (not shown in the figure) to maintain a fixed spacing between them. According to this embodiment, the OLED 10 is a rear emission type panel. Therefore, the surface 12a of the second substrate 12 facing away from the first substrate 11 is the display surface 12a of the OLED 10. The second substrate 12 is made of transparent materials such as glass, plastic, quartz, or other transparent materials. The first substrate 11 may be made of either transparent materials or non-transparent materials. The second substrate 12 comprises a plurality of sub-pixels 40, each of which comprises an organic emitting element 46, a thin film transistor (TFT), an antireflective layer, and other thin film layers. In the following, each layer of materials on the second substrate 12 will be introduced from bottom to top according to the structure of the side cross-section of the OLED 10.

An antireflective layer 14 is positioned on the surface of the second substrate 12 close to the first substrate 11, and it has an opening 14a. In this embodiment, the antireflective layer 14 is a black matrix (BM) which may absorb the ambient light propagating into the OLED 10 through the display surface 12a and prevent the influence of the reflection of the ambient light on the contrast ratio of the display images of the OLED 10. The material of the BM may be chrome, chromic oxide and chromic nitride, or other materials which have good quality of antireflection. It is preferred that the antireflective rate of the BM is less than 7%. Since the antireflective layer 14 is non-transparent, the portion in the sub-pixel 40 which has the antireflective layer 14 is defined as a non-emitting region 44 and the portion in this sub-pixel 40 without the antireflective layer 14 (the opening 14a of the antireflective layer 14) is defined as an emitting region 42.

A non-conductive buffer layer 15 covers the surface of the antireflective layer 14. On the buffer layer 15, a transistor is placed comprising a gate 24, a gate dielectric layer 16, a drain 18, a source 20, and a semiconductor layer 22 serving as the channel of the transistor. In addition, a conductive layer 28 is positioned on the drain 18 and the source 20 to connect a data line (not shown in the figure) and the pixel electrode 32 respectively. Since the materials of the transistor and the conductive layer 28 usually comprise conductive materials with the property of antireflection, such as metal, the transistor and conductive layer 28 in this invention are placed directly above the antireflective layer 14 to prevent the transistor and the conductive layer from reflecting ambient light.

A first inter-layer dielectric layer 26 is on the gate dielectric layer 16, and a second inter-layer dielectric layer 30 and a non-conductive planar layer 34 are placed in the non-emitting region 44 above the conductive layer 28, wherein the first inter-layer dielectric layer 26 and the second inter-layer dielectric layer 30 may be made of silicon nitride ($SiN_x$), silicon oxide ($SiO_x$), tetra-ethyl-ortho-silicate (TEOS), or other non-conductive organic or inorganic materials, and the material of the planar layer 34 may be organic materials, such as acrylic resin, or the materials described above for the inter-layer dielectric layers. The organic emitting elements 46 are placed on top of the above-described non-conductive layers and in the emitting region 42 of each sub-pixel 40. The organic emitting element 46 comprises a pixel electrode 32 as the anode, an organic emitting layer 36, and a cathode 38. According to this embodiment, the material of the pixel electrode 32 is preferred to comprise transparent metal oxides, such as Indium-tin-oxide (ITO) or Indium-zinc-oxide (IZO). The cathode 38 is preferred to comprise materials with high reflective property, such as aluminum, Ag, alum or Ag alloy or other metal materials to reflect the light from the organic emitting layer 36 for increasing the luminosity. The organic emitting layer 36 comprises a hole transporting layer, an emitting layer, and an electron transporting layer, and it is actuated by the pixel electrode 32 and the cathode 38 to emit lights. Therefore, the antireflective layer 14 is disposed between the transistors and the substrate 12, and the transistors are disposed between the organic emitting elements 46 and the antireflective layer 14.

Figure 2:
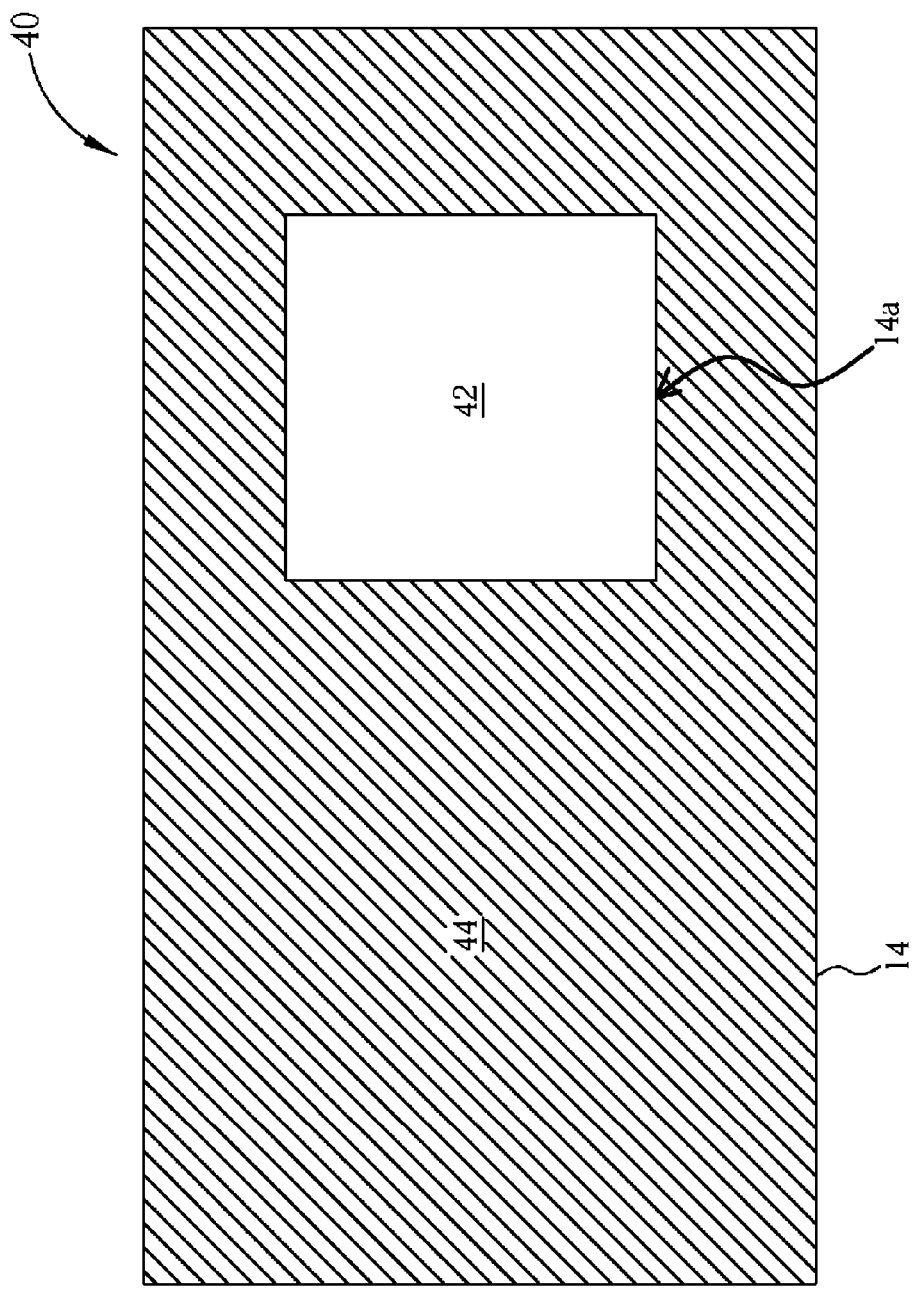
FIG. 2 is an enlarged schematic diagram of the sub-pixel of the OLED shown in FIG. 1.

FIG. 2 is the placement schematic diagram of the sub-pixel 40 of the OLED 10 shown in FIG. 1. As shown in FIG. 2, the opening 14a of the anti-reflective layer 14 is the emitting region 42 of the sub-pixel 40, and the portion of the sub-pixel 40 comprising the antireflective layer 14 is defined as the non-emitting region 44. According to this embodiment, the non-emitting region 44/sub-pixel 40 area ratio is about 60% to 87%, preferable about 70% to 87%. However, it should be noted that the non-emitting region 44/sub-pixel 40 area ratio may be different or not completely the same in each sub-pixel to create the best performance of the display images.

As previously mentioned, because the cathode 38 is made of materials with high reflective property, the antireflective layer 14 placed between the organic emitting elements 46 and the display surface 12a must occupy certain area (i.e. the area of the non-emitting region) to absorb sufficient ambient lights for preventing the contrast ratio of the display images from being reduced by the cathode 38 reflecting ambient lights. However, when the non-emitting region 44 occupies a large area of the sub-pixel 40, the antireflective layer 14 may also shield relatively a large amount of the light produced by the organic emitting elements 46, which causes the entire luminosity of the display images of the OLED 10 reduced. To maintain certain luminosity, a conventional method is to provide more electric current to the organic emitting elements 46 to increase its luminous efficiency. However, in the situation with more electric current, the operation life time of the organic emitting elements 46 may be affected. Therefore, the characteristic of this invention is to provide a method to determine the optimal area ratio of the non-emitting region 44 to the sub-pixel 40 (i.e. antireflective layer/sub-pixel area ratio or anti-reflect/sub-pixel ratio).

Figure 3:
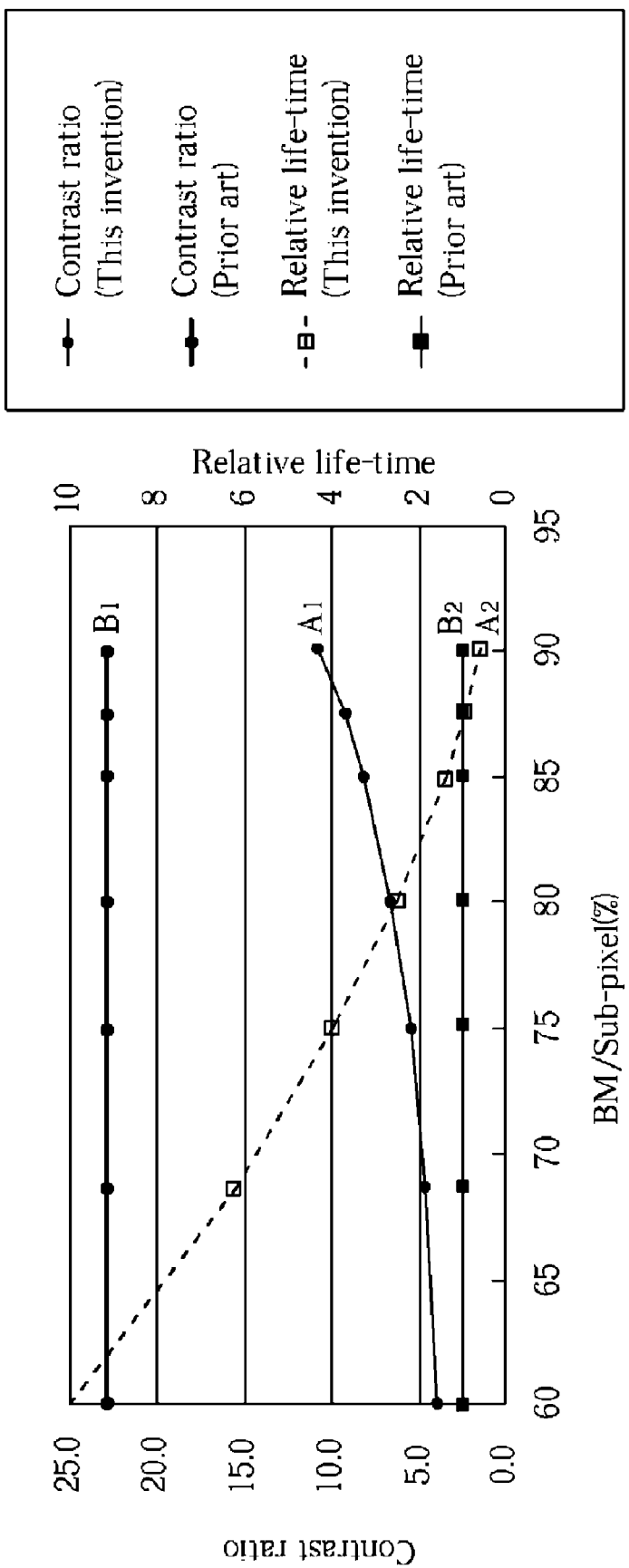
FIG. 3 is a curve diagram of the relationship of the anti-reflective/sub-pixel ratio versus the relative life time of organic emitting elements and the contrast ratio.

Please refer to FIG. 3. FIG. 3 is a curve diagram of the relationship of the antireflective layer/sub-pixel ratio (i.e. the BM/sub-pixel ratio) versus the relative life time of the organic emitting elements and the contrast ratio. Curves $A_1$ and $A_2$ are the estimate relation curves of the contrast ratio of the OLED 10 and the relative life time of the organic emitting elements 46 respectively versus the BM/sub-pixel ratio of the OLED 10 in this invention. Curves $B_1$ and $B_2$ are the relation curves of the contrast ratio and the relative life time of the organic emitting elements respectively versus the BM/sub-pixel ratio of the OLED according to the prior art with a polarizer, which are used as a comparison to this invention, wherein the penetration rate of the polarizer of the OLED according to the prior art is 42%.

Those skilled in the art know that the contrast ratio of the display shown by the curve $A_1$ has the following relation equation:

$$C.R. = I_{on}/I_{off} \quad (a)$$

wherein "C.R." is defined as the contrast ratio of the display; "$I_{on}$" represents the luminosity of the display while it is on its full luminosity, which means the sum of the maximum luminosity of the display and the luminosity of the reflected ambient light; and "$I_{off}$" represents the luminosity of the display while it is in complete darkness, which means the luminosity of the reflected ambient light. In addition, in this embodiment, the following relation equation affects the curve $A_2$:

$$(T_2/T_1) = (L_1/L_2)^r \quad (b)$$

Here "$T_1$" and "$T_2$" respectively represent the luminosities of the organic emitting elements 46 with different electric currents, and "$L_1$" and "$L_2$" respectively represent the life time of the organic emitting elements 46 under the conditions of $T_1$ and $T_2$, and "r" is defined as the acceleration factor for the life time of the organic emitting elements 46.

The method of this invention compares life time of the organic emitting elements and the contrast ratio of OLEDs known in the prior art, and uses the curves $A_1$ and $A_2$ to determine the optimal range of the BM/sub-pixel ratio of the OLED of this invention. For example, a contrast ratio above 3.0 is generally acceptable, wherein a contrast ratio of 5.0 is preferred. Therefore, to design an OLED with the minimum contrast ratio of 3.0 and the life time of the organic emitting elements not shorter than that of the prior art OLED, find the point of 3.0 on the vertical axis in the left side of FIG. 3, move horizontally to meet the curve $A_1$, and the BM/sub-pixel ratio corresponding to the contrast ratio of 3.0 is found to be 60%. Then look up the point of 1.0 on the vertical axis in the right side of the relative life time of the organic emitting elements, move horizontally to the curve $A_2$, find the corresponding BM/sub-pixel ratio of the OLED of this invention which has the relative life time of 1.0 to the prior art is 87%. As a result, the area ratio of the non-emitting region 44 to the sub-pixel 40 in FIG. 2 is determined to be between about 60% and 87%. Moreover, to design an OLED of this invention with the contrast ratio over 5.0, find the point of 5.0 on the vertical axis of the contrast ratio, move horizontally to the curve $A_1$, and then find the corresponding BM/sub-pixel ratio is 70%. Therefore, the preferred area ratio of the non-emitting region 44 to the sub-pixel 40 of this invention OLED 10 is between about 70% and 87%. Based on the previous explanation, those skilled in the art shall realize that while designing the area ratio of the non-emitting region 44 to the sub-pixel 40, we may estimate a relation equation between the area ratio of the non-emitting region to the sub-pixel and the contrast ratio under a predetermined ambient light and based on the characteristics of the displays, to determine the a preferable reset range of the area ratio non-emitting region to the sub-pixel.

It should be noted that the application of this invention is not limited to the rear emission type structure of the OLED as in FIG. 1. It may be applied to other displays with different structures such as top emission type OLED or displays with color filters.

In contrast to the prior art, this invention provides an OLED which does not require a polarizer but provides high contrast ratio by adjusting the design of the antireflective layer (non-emitting)/sub-pixel area ratio. Since this invention OLED does not contain the polarizer with penetration rate under 50%, high voltage for the organic emitting elements to increase the luminosity is not required, which furthermore increases the life time of the organic emitting elements to allow the OLED of this invention to have both good contrast ratio and long life time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An organic light emitting display (OLED) comprising:
    a first substrate;
    a second substrate, positioned relatively under the first substrate, comprising a plurality of sub-pixels;
    a plurality of organic emitting elements disposed respectively in each of the sub-pixels; and
    an antireflective layer formed in each of the sub-pixels, wherein a ratio of the area of the antireflective layer to that of the sub-pixel is between about 60% and about 87%, and the ratios of the area of the antireflective layer positioned inside each of the sub-pixels to the area of the sub-pixels are not all the same;
    wherein the OLED is a rear emission type OLED panel.

2. The OLED of claim 1, wherein the antireflective layer is a non-emitting region.

3. The OLED of claim 1, wherein the ratio of the area of the antireflective layer to that of the sub-pixel is between about 70% and about 87%.

4. The OLED of claim 1, wherein the antireflective layer has a reflectivity of less than 7%.

5. The OLED of claim 1, wherein a surface of the second substrate facing away from the first substrate is a display surface of the OLED.

6. The OLED of claim 1, wherein the antireflective layer comprises a black matrix (BM).

7. A method for improving the contrast ratio of an OLED comprising a first substrate, a second substrate, positioned relatively under the first substrate, comprising a plurality of sub-pixels, a plurality of organic emitting elements disposed respectively in each of the sub-pixels, and an antireflective layer formed in each of the sub-pixels, wherein a ratio of the area of the antireflective layer to that of the sub-pixel is defined as an anti-reflect/sub-pixel ratio, the method comprising the steps of:
    determining a first relation equation of the relative life time of the organic emitting elements versus the anti-reflect/sub-pixel ratio based on characteristics of the organic emitting elements;
    determining a second relation equation of the contrast ratio of the OLED versus the anti-reflect/sub-pixel ratio based on characteristics of the OLED;
    choosing a predetermined minimum value of the contrast ratio and a predetermined minimum value of the relative life time, and calculating a preset range of the anti-reflect/sub-pixel ratio based on the first and the second relation equations; and
    designing an area occupied by the antireflective layer in each of the sub-pixels based on the preset range of the anti-reflect/sub-pixel ratio to make the contrast ratio of the OLED equal to or more than the predetermined minimum value of the contrast ratio, and to make the relative life time of the organic emitting elements of the OLED equal to or more than the predetermined minimum value of the relative life time wherein the preset range of the anti-reflect/sub-pixel ratio is between about 60% and 87%.

8. The method of claim 7, wherein the predetermined minimum value of the contrast ratio is about 3.0.

9. The method of claim 7, wherein the predetermined minimum value of the contrast ratio is about 5.0.

10. The method of claim 9, wherein the preset range of the anti-reflect/sub-pixel ratio is between about 70% and about 87%.

11. The method of claim 7, wherein the predetermined minimum value of the relative life time is about 1.0.

12. The method of claim 7, wherein the first relation equation is $(T_2/T_1)=(L_1/L_2)^r$, where $T_1$ and $T_2$ represent the luminosity provided by the organic emitting elements with different currents, $L_1$ and $L_2$ represent the life time of the organic emitting elements under the conditions of $T_1$ and $T_2$, respectively, and r represents the acceleration factor for the life time of the organic emitting elements.

13. The method of claim 7, wherein the reflectivity of the antireflective layer is less than about 7%.

14. The OLED of claim 1, further comprising a plurality of thin film transistors disposed respectively in each of the sub-pixels on the second substrate, and the antireflective layer is disposed between the thin film transistors and the second substrate.

15. The OLED of claim 1, further comprising a plurality of thin film transistors disposed respectively in each of the sub-pixels on a surface of the second substrate, the antireflective layer is disposed on the second substrate, and the thin film transistors are disposed between the organic emitting elements and the antireflective layer.

* * * * *